United States Patent
Jang et al.

[11] Patent Number: 6,043,136
[45] Date of Patent: Mar. 28, 2000

[54] TRENCH FILLING METHOD EMPLOYING OXYGEN DENSIFIED GAP FILLING CVD SILICON OXIDE LAYER

[75] Inventors: Syun-Ming Jang, Hsin-Chu; Ying-Ho Chen, Taipei; Chen-Hua Yu, Hsin-Chu, all of Taiwan

[73] Assignee: Taiwan Semiconductor Manufacturing Company, Ltd., Hsin-Chu, Taiwan

[21] Appl. No.: 09/121,710

[22] Filed: Jul. 24, 1998

Related U.S. Application Data

[62] Division of application No. 08/810,389, Mar. 3, 1997, Pat. No. 5,817,566.

[51] Int. Cl.⁷ .................................................. H01L 21/762
[52] U.S. Cl. ......................... 438/424; 438/437; 438/790
[58] Field of Search ................................... 438/424, 427, 438/437, FOR 227, 790; 427/97

[56] References Cited

U.S. PATENT DOCUMENTS

| | | | |
|---|---|---|---|
| 5,362,526 | 11/1994 | Wang et al. ............................. | 427/573 |
| 5,393,708 | 2/1995 | Hsia et al. ............................... | 437/228 |
| 5,462,899 | 10/1995 | Ikeda ....................................... | 437/238 |
| 5,472,904 | 12/1995 | Figura et al. ............................ | 437/67 |
| 5,674,783 | 10/1997 | Jang et al. . | |
| 5,702,977 | 12/1997 | Jang et al. . | |
| 5,741,740 | 4/1998 | Jang et al. . | |
| 5,855,957 | 1/1999 | Yuan . | |
| 5,869,384 | 2/1999 | Yu et al. . | |

Primary Examiner—George Fourson
Attorney, Agent, or Firm—George O. Saile; Stephen B. Ackerman; Alek P. Szecsy

[57] ABSTRACT

A method for forming a silicon oxide layer. There is first provided a substrate. There is then formed over the substrate a silicon oxide layer, where the silicon oxide layer is formed through an ozone assisted sub-atmospheric pressure thermal chemical vapor deposition (SACVD) method employing an ozone oxidant and a tetra-ethyl-ortho-silicate (TEOS) silicon source material at an ozone:TEOS volume ratio of from about 10:1 to about 14:1. Finally, there is then annealed thermally the substrate within an oxygen containing atmosphere at a temperature of greater than about 1100 degrees centigrade to form from the silicon oxide layer a densified silicon oxide layer. The densified silicon oxide layer formed employing the method is formed with an unexpectedly low shrinkage.

3 Claims, 2 Drawing Sheets

TRENCH FILLING METHOD EMPLOYING OXYGEN DENSIFIED GAP FILLING CVD SILICON OXIDE LAYER

This is a division of patent application Ser. No. 08/810,389, filing date Mar. 3, 1997, now U.S. Pat. No. 5,817,566 Trench Filling Method Employing Oxygen Densified Gap Filling CVD Silicon Oxide Layer Formed With Low Ozone Concentration, assigned to the same assignee as the present invention.

BACKGROUND OF THE INVENTION

1. Field of the Invention

The present invention relates generally to methods for forming trench fill layers within trenches within substrates employed in integrated circuit fabrication. More particularly, the present invention relates to methods for forming gap filling ozone assisted thermal chemical vapor deposited (CVD) silicon oxide trench fill layers within trenches within substrates employed in integrated circuit fabrication.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

As integrated circuit technology has advanced and integrated circuit device dimensions have decreased, it has become increasingly common within advanced integrated circuits to employ trench isolation methods such as shallow trench isolation (STI) methods and recessed oxide isolation (ROI) methods to form trench isolation regions nominally co-planar with adjoining active semiconductor regions of semiconductor substrates. Such trench isolation methods typically employ a chemical mechanical polish (CMP) planarizing method to provide a nominally planarized surface to a trench isolation region formed from a trench fill dielectric layer formed within the trench. Trench isolation regions nominally co-planar with active semiconductor regions within semiconductor substrates are desirable since they optimize, when subsequently forming patterned layers upon those nominally co-planar trench isolation regions and active semiconductor regions, the limited depth of focus typically achievable with advanced photoexposure tooling.

When forming within advanced integrated circuits trench isolation regions within isolation trenches, it has become common to employ as trench fill dielectric layers gap filling silicon oxide layers formed through ozone assisted sub-atmospheric pressure thermal chemical vapor deposition (SACVD) methods. Silicon oxide layers formed through such methods are desirable since such silicon oxide layers possess the inherently superior gap filling characteristics desirable for trenches of limited dimensions typically encountered in advanced integrated circuit fabrication.

While gap filling silicon oxide layers formed through ozone assisted sub-atmospheric pressure thermal chemical vapor deposition (SACVD) methods are thus desirable as trench fill layers within trenches within advanced integrated circuit fabrication, methods through which are formed such gap filling silicon oxide layers are not entirely without problems. In particular, it is known in the art that gap filling silicon oxide layers formed through ozone assisted sub-atmospheric pressure thermal chemical vapor deposition (SACVD) methods exhibit a surface sensitivity dependent upon the substrate layers upon which are formed those gap filling silicon oxide layers. In particular, when employing as substrate layers thermally grown silicon oxide layers which are typically employed as isolation trench liner layers within isolation trenches formed within semiconductor substrates, gap filling silicon oxide layers formed through ozone assisted sub-atmospheric pressure thermal chemical vapor deposition (SACVD) methods exhibit inhibited formation rates. Inhibited formation rates within isolation trenches within semiconductor substrates of gap filling silicon oxide trench fill layers formed through ozone assisted sub-atmospheric pressure thermal chemical vapor deposition (SACVD) methods are undesirable since there is then formed within those isolation trenches gap filling silicon oxide trench fill layers which are particularly susceptible to dishing when subsequently planarized through chemical mechanical polish (CMP) planarizing methods.

It is thus towards the goal of forming within advanced integrated circuits gap filling silicon oxide trench fill layers formed through ozone assisted sub-atmospheric pressure thermal chemical vapor deposition (SACVD) methods, while avoiding a surface sensitivity, that the present invention is generally directed.

Methods and materials through which silicon oxide layers may be formed with desirable properties within integrated circuits are known in the art of integrated circuit fabrication. For example, Wang et al, in U.S. Pat. No. 5,362,526 discloses several thermal chemical vapor deposition (CVD) methods and plasma enhanced chemical vapor deposition (PECVD) methods for forming silicon oxide layers with gap filling properties over irregular surfaces within integrated circuits. The methods are characterized by comparatively high reactor chamber pressures. In addition, Hsia et al., in U.S. Pat. No. 5,393,708 discloses a method for forming a composite planarizing silicon oxide inter-metal dielectric (IMD) layer within an integrated circuit. The method employs a pair of silicon oxide layers formed through a plasma enhanced chemical vapor deposition (PECVD) method, a single silicon oxide layer formed through a thermal chemical vapor deposition (CVD) method and a single silicon oxide layer formed through a spin-on-glass (SOG) method.

Yet further, Ikeda, in U.S. Pat. No. 5,462,899 discloses an ozone assisted thermal chemical vapor deposition (CVD) method for forming a gap filling silicon oxide layer within an integrated circuit. The method employs a low ozone concentration within distribution piping through which is carried a tetra-ethyl-ortho-silicate (TEOS) silicon source material employed in forming the silicon oxide layer. Finally, Figura et al., in U.S. Pat. No. 5,472,904 disclose a method for simultaneously forming a silicon oxide narrow trench isolation region and a silicon oxide recessed oxide isolation (ROI) region within a semiconductor substrate. The method employs an oxidation barrier formed within a narrow trench within which is formed the silicon oxide narrow trench isolation region, but not within a wide trench within which is formed the silicon oxide recessed oxide isolation (ROI) region.

Desirable in the art are additional methods through which trenches within substrates employed within integrated circuit fabrication may be filled with gap filling silicon oxide trench fill layers formed through ozone assisted sub-atmospheric pressure thermal chemical vapor deposition (SACVD) methods, while avoiding a surface sensitivity when forming those gap filling silicon oxide trench fill layers. Particularly desirable are additional methods through which isolation trenches within semiconductor substrates employed within integrated circuit fabrication may be filled with gap filling silicon oxide trench fill dielectric layers formed through ozone assisted sub-atmospheric thermal chemical vapor deposition (SACVD) methods, while avoiding a surface sensitivity when forming those gap filling silicon oxide trench fill dielectric layers. It is towards these goals that the present invention is directed.

SUMMARY OF THE INVENTION

A first object of the present invention is to provide a method through which a trench within a substrate employed in integrated circuit fabrication may be filled with a gap filling silicon oxide trench fill layer formed through a sub-atmospheric pressure thermal chemical vapor deposition (SACVD) method.

A second object of the present invention is to provide a method in accord with the first object of the present invention, where there is avoided a surface sensitivity when forming the gap filling silicon oxide trench fill layer.

A third object of the present invention is to provide a method in accord with the first object of the present invention and the second object of the present invention, where the substrate is a semiconductor substrate and the trench is an isolation trench.

A fourth object of the present invention is to provide a method in accord with the first object of the present invention, the second object of the present invention and the third object of the present invention, which method is readily manufacturable.

In accord with the objects of the present invention, there is provided by the present invention a method for forming within a trench within a substrate employed in integrated circuit fabrication a gap filling silicon oxide trench fill layer. To practice the method of the present invention, there is first provided a substrate having a trench formed therein. There is then formed over the substrate and within the trench a gap filling silicon oxide trench fill layer. The gap filling silicon oxide trench fill layer is formed through an ozone assisted sub-atmospheric pressure thermal chemical vapor deposition (SACVD) method. The method employs an ozone oxidant and a tetra-ethyl-ortho-silicate (TEOS) silicon source material at an ozone:TEOS volume ratio of less than about 2:1. Finally, the substrate is thermally annealed within an oxygen containing atmosphere at a temperature of greater than about 1100 degrees centigrade to form from the gap filling silicon oxide trench fill layer a densified gap filling silicon oxide trench fill layer.

The present invention provides a method through which there may be formed within a trench within a substrate employed in integrated circuit fabrication a gap filling silicon oxide trench fill layer formed through a sub-atmospheric pressure thermal chemical vapor deposition (SACVD) method, where there is avoided a surface sensitivity when forming the gap filling silicon oxide trench fill layer. By forming through the method of the present invention the gap filling silicon oxide trench fill layer through an ozone assisted sub-atmospheric pressure thermal chemical vapor deposition (SACVD) method employing an ozone oxidant and a tetra-ethyl-ortho-silicate (TEOS) silicon source material at an ozone:TEOS volume ratio of less than about 2:1, there is formed a gap filling silicon oxide trench fill layer with limited surface sensitivity. Additionally, by thermally annealing the gap filling silicon oxide trench fill layer in an oxygen containing atmosphere at a temperature of greater than about 1100 degrees centigrade there is formed from the gap filling silicon oxide trench fill layer a densified gap filling silicon oxide trench fill layer which advantageously possesses desirable characteristics such as, but not limited to: (1) a low etch rate in dilute hydrofluoric acid; and (2) a minimal shrinkage.

The method of the present invention may be practiced where the substrate is a semiconductor substrate and where the trench is an isolation trench within the semiconductor substrate. The method of the present invention does not discriminate with respect to the nature of the substrate and the nature of the trench formed within the substrate, since within the method of the present invention a surface sensitivity of the gap filling silicon oxide trench fill layer formed through the sub-atmospheric pressure thermal chemical vapor deposition (SACVD) method is influenced by the volume ratio of an ozone oxidant and a tetra-ethyl-orthosilicate (TEOS) silicon source material employed in forming the gap filling silicon oxide trench fill layer. Thus, the method of the present invention may successfully be practiced when the substrate is a semiconductor substrate and when the trench is an isolation trench formed within the semiconductor substrate.

The method of the present invention is readily manufacturable. The method of the present invention employs for forming a gap filling silicon oxide trench fill layer an ozone oxidant and a tetra-ethyl-ortho-silicate (TEOS) silicon source material at an ozone:TEOS volume ratio of less than about 2:1, while the method of the present invention also employs when forming from the gap filling silicon oxide trench fill layer a densified gap filling silicon oxide trench fill layer a thermal annealing method in an oxygen containing atmosphere at a temperature of greater than about 1100 degrees centigrade. Since: (1) methods through which volume concentrations of an ozone oxidant and a tetra-ethyl-ortho-silicate (TEOS) silicon source material may be controlled when forming gap filling silicon oxide trench fill layers are generally known in the art of integrated circuit fabrication; and (2) methods through which a thermal annealing of a semiconductor substrate may be undertaken within an oxygen containing atmosphere are also generally known in the art of integrated circuit fabrication, the method of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming, while avoiding a surface sensitivity, a gap filling silicon oxide trench fill layer within a trench within a substrate employed within integrated circuit fabrication. To achieve this goal, the method of the present invention provides that there is formed over the substrate and within the trench a gap filling silicon oxide trench fill layer formed through an ozone assisted sub-atmospheric pressure thermal chemical vapor deposition (SACVD) method. The method employs an ozone oxidant and a tetra-ethyl-ortho-silicate (TEOS) silicon source material at an ozone:TEOS volume ratio of less than about 2:1. The gap filing silicon oxide trench fill layer once formed may be densified through annealing in an oxygen atmosphere at a temperature of greater than about 1100 degrees centigrade to form a densified gap filling silicon oxide trench fill layer. The densified gap filling silicon oxide trench fill layer has the additional advantageous properties of a low etch rate in dilute hydrofluoric acid and a low shrinkage. The densified gap filling silicon oxide trench fill layer may be planarized through a chemical mechanical polish (CMP) planarizing method to form within the trench a patterned planarized densified gap filling silicon oxide trench fill layer.

Although the preferred embodiment of the method of the present invention illustrates the method of the present invention employed in forming, while avoiding a surface sensitivity, a pair of patterned planarized densified gap filling silicon oxide trench fill dielectric layers within a pair of isolation trenches within a semiconductor substrate employed in integrated circuit fabrication, the method of the present invention may also be employed in forming, while avoiding a pattern sensitivity, the densified gap filling silicon oxide trench fill layer or the patterned planarized densified gap filling silicon oxide trench fill layers of the method of the present invention within trenches other than isolation trenches within substrates other than semiconductor substrates. The method of the present invention may be employed in forming, while avoiding a surface sensitivity, the densified gap filling silicon oxide trench fill layer or the patterned planarized densified gap filling silicon oxide trench fill layers of the present invention into trenches within substrates including but not limited to dielectric substrates, semiconductor substrates and conductor substrates. For a general application of the method of the present invention, the width of the trench into which is formed the gap filling silicon oxide trench fill layer is preferably greater than about 0.3 microns and the depth of the trench is preferably from about 3000 to about 5000 angstroms.

Figure 1:
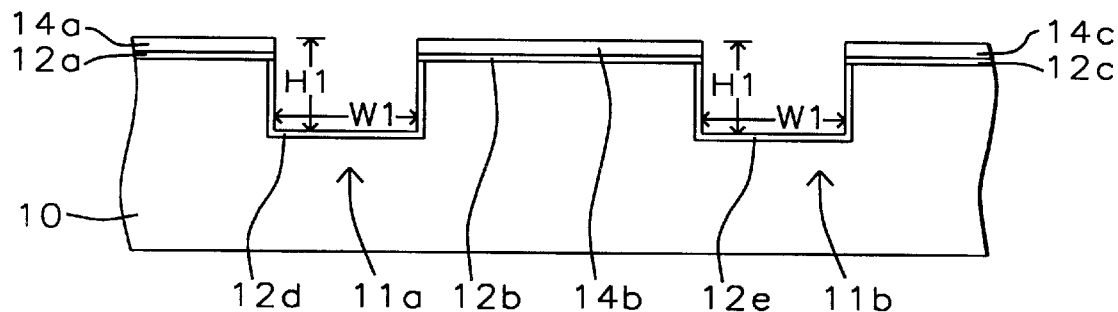
FIG. 1 to FIG. 4 show a series of schematic cross-sectional diagrams illustrating the results of progressive stages in forming within an isolation trench within a semiconductor substrate employed in integrated circuit fabrication a patterned planarized densified gap filling silicon oxide trench fill dielectric layer formed, while avoiding a surface sensitivity, in accord with the preferred embodiment of the method of the present invention.

Referring now to FIG. 1 to FIG. 4, there is shown a series of schematic cross-sectional diagrams illustrating the results of progressive stages in forming, while avoiding a surface sensitivity, a pair of patterned planarized densified gap filling silicon oxide trench fill dielectric layers within a pair of isolation trenches within a semiconductor substrate in accord with the preferred embodiment of the method of the present invention. Shown in FIG. 1 is a schematic cross-sectional diagram of the semiconductor substrate at an early stage in its fabrication.

Shown in FIG. 1 is a semiconductor substrate 10 having formed therein a pair of isolation trenches 11a and 11b, where a gap filling silicon oxide trench fill dielectric layer when formed into the pair of isolation trenches 11a and 11b through a sub-atmospheric pressure thermal chemical vapor deposition (SACVD) method conventional in the art of integrated circuit fabrication and subsequently planarized through a chemical mechanical polish (CMP) planarizing method conventional in the art of integrated circuit fabrication forms a pair of patterned planarized gap filling silicon oxide trench fill layers having a pair of dishes formed therein. Although the method of the present invention may be practiced employing semiconductor substrates of either dopant polarity, any dopant concentration and various crystallographic orientations, within the preferred embodiment of the method of the present invention the semiconductor substrate 10 is preferably a (100) silicon semiconductor substrate having an N- or P- doping. As is illustrated in FIG. 1, each of the isolation trenches 11a and 11b within the semiconductor substrate 10 has a width W1 and a height H1, where the width W1 is preferably greater than about 0.3 microns while the height H1 is preferably from about 3000 to about 5000 angstroms.

Formed upon the semiconductor substrate 10 and defining the widths W1 of the isolation trenches 11a and 11b is a series of patterned silicon oxide pad oxide layers 12a, 12b and 12c having formed and aligned thereupon a series of patterned silicon nitride layers 14a, 14b and 14c. Within the preferred embodiment of the method of the present invention, the series of patterned silicon nitride layers 14a, 14b and 14c serves as a series of patterned chemical mechanical polish (CMP) polish stop layers, while the series of patterned silicon oxide pad oxide layers 12a,12b and 12c serves as a series of adhesive forming and stress reducing layers between the semiconductor substrate 10 and the series of patterned silicon nitride layers 14a, 14b and 14c. While the series of patterned silicon oxide pad oxide layers 12a, 12b and 12c,and the series of patterned silicon nitride layers 14a, 14b and 14c,are preferably employed within the preferred embodiment of the method of the present invention, they are not required within the method of the present invention. However, their presence provides a means for most uniformly forming within the isolation trenches 11a and 11b patterned planarized densified gap filling silicon oxide trench fill dielectric layers through the preferred embodiment of the method of the present invention.

The patterned silicon oxide pad oxide layers 12a, 12b and 12c, and the patterned silicon nitride layers 14a, 14b and 14c may be formed through methods as are conventional in the art of integrated circuit fabrication, which will typically, although not exclusively, employ photolithographic patterning of a blanket silicon oxide pad oxide layer which is formed beneath a corresponding blanket silicon nitride layer. The blanket silicon nitride layer and the blanket silicon oxide pad oxide layer may similarly be formed through methods as are conventional in the art of integrated circuit fabrication, including but not limited to thermal oxidation methods, chemical vapor deposition (CVD) methods and physical vapor deposition (PVD) sputtering methods, as are appropriate. Preferably, the patterned silicon oxide pad oxide layers 12a, 12b and 12c, and the corresponding blanket silicon oxide pad oxide layer, are formed to a thickness of from about 90 to about 130 angstroms each, where the blanket silicon oxide pad oxide layer is preferably formed through a thermal oxidation method at a temperature of from about 850 to about 950 degrees centigrade. Preferably, the patterned silicon nitride layers 14a, 14b and 14c, and the corresponding blanket silicon nitride layer, are formed to a thickness of from about 1500 to about 2000 angstroms each.

Also shown in FIG. 1 is the presence of a pair of patterned silicon oxide trench liner layers 12d and 12e formed into the corresponding isolation trenches 11a and 11b. Preferably, the patterned silicon oxide trench liner layers 12d and 12e are formed in a self aligned fashion within each isolation trench 11a or 11b through a thermal oxidation method analogous or equivalent to the thermal oxidation method preferably employed in forming the blanket silicon oxide pad oxide layer from which is formed the patterned silicon oxide pad oxide layers 12a, 12b and 12c. Preferably, the patterned silicon oxide trench liner layers 12d and 12e have a thickness of from about 200 to about 400 angstroms each. The patterned silicon oxide trench liner layers 12d and 12e are particularly desirable within advanced integrated circuit fabrication since, when formed through a thermal oxidation method, they provide a superior leakage barrier between the semiconductor substrate 10 and trench fill dielectric layers subsequently formed within the isolation trenches 11a and 11b. Unfortunately, when formed through the thermal oxidation method, the patterned silicon oxide trench liner layers 12d and 12e provide substrate layers upon which there is exhibited a surface sensitivity manifested as an inhibited formation rate of gap filling silicon oxide trench fill dielectric layers formed through conventional ozone assisted sub-atmospheric pressure thermal chemical vapor deposition (SACVD) methods upon the patterned silicon oxide trench liner layers 12d and 12e.

Figure 2:
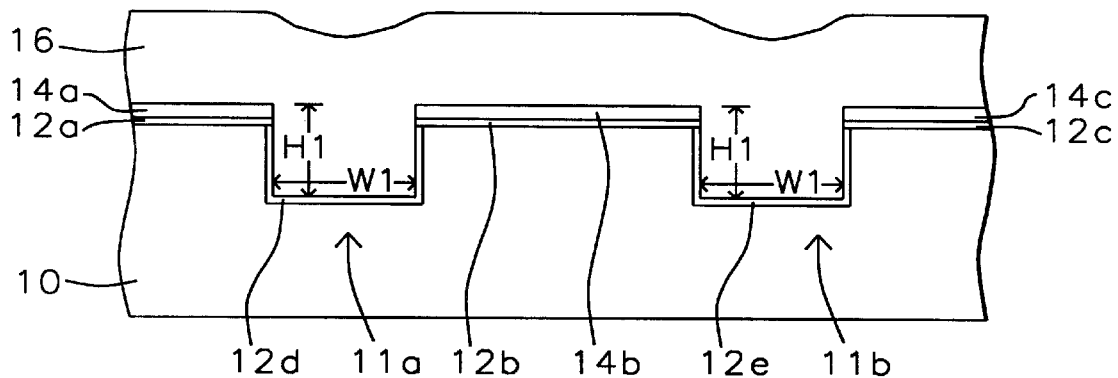

Referring now to FIG. 2, there is shown a schematic cross-sectional diagram illustrating the results of further processing of the semiconductor substrate 10 whose schematic cross-sectional diagram is illustrated in FIG. 1. Shown in FIG. 2 is a schematic cross-sectional diagram of the semiconductor substrate 10 otherwise equivalent to the semiconductor substrate 10 whose schematic cross-sectional diagram is illustrated in FIG. 1, but wherein there is formed over the semiconductor substrate 10 and into the isolation trenches 11a and 11b a gap filling silicon oxide trench fill dielectric layer 16. Within the context of the method of the present invention, the gap filling silicon oxide trench fill dielectric layer 16 is formed through an ozone assisted sub-atmospheric pressure thermal chemical vapor deposition (SACVD) method. Due to the elevated pressures at which ozone assisted sub-atmospheric pressure thermal chemical vapor deposition (SACVD) methods are employed, these methods preclude plasma activation, but nonetheless provide superior gap filling and planarizing properties to gap filling silicon oxide trench fill dielectric layers formed through these methods. Preferably, the ozone assisted sub-atmospheric pressure thermal chemical vapor deposition (SACVD) method employs an ozone oxidant and a tetra-ethyl-ortho-silicate (TEOS) silicon source material at an ozone:TEOS volume ratio of less than about 2:1.

Other parameters employed in forming the gap filling silicon oxide trench fill dielectric layer 16 through the sub-atmospheric pressure thermal chemical vapor deposition (CVD) method include: (1) a reactor chamber pressure of from about 40 to about 80 torr; (2) a substrate temperature of from about 325 to about 475 degrees centigrade; (3) an ozone concentration of about 12 weight percent in an oxygen carrier gas; (4) a tetra-ethyl-ortho-silicate (TEOS) flow rate of from about 27 to about 42 standard cubic centimeters per minute (sccm); (5) an oxygen (ozone carrier gas) flow rate of from about 600 to about 900 standard cubic centimeters per minute (sccm); and (6) a background helium carrier gas flow rate of from about 1850 to about 2750 standard cubic centimeters per minute (sccm). Preferably, the gap filling silicon oxide trench fill dielectric layer 16 is formed to a thickness of from about 6000 to about 8000 angstroms over the semiconductor substrate 10. As is illustrated in FIG. 2, the gap filling silicon oxide trench fill dielectric layer 16 is formed while avoiding a surface sensitivity over the isolation trenches 11a and 11b since the gap filing silicon oxide trench fill dielectric layer 16 is formed with a comparatively low volume ratio of the ozone oxidant to the tetra-ethyl-ortho-silicate (TEOS) silicon source material.

Figure 3:
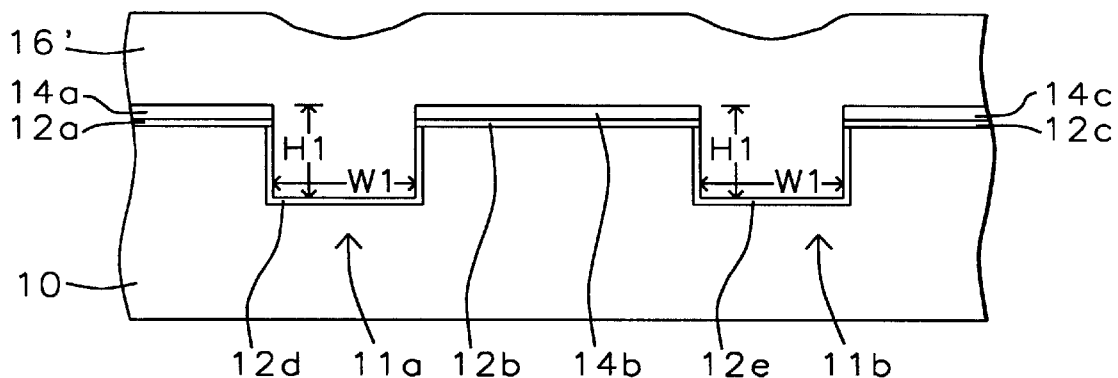

Referring now to FIG. 3, there is shown a schematic cross-sectional diagram illustrating the results of further processing of the semiconductor substrate 10 whose schematic cross-sectional diagram is illustrated in FIG. 2. Shown in FIG. 3 is the results of thermally annealing in an oxygen containing atmosphere the semiconductor substrate 10 whose schematic cross-sectional diagram is illustrated in FIG. 2. When thermally annealing in the oxygen containing atmosphere the semiconductor substrate 10 whose schematic cross-sectional diagram is illustrated in FIG. 2, the gap filling silicon oxide trench fill dielectric layer 16 is densified to form a densified gap filling silicon oxide trench fill dielectric layer 16'. Advantageously, the densified gap filling silicon oxide trench fill dielectric layer 16' has, with respect to the gap filling silicon oxide trench fill layer 16: (1) a comparatively low etch rate in a dilute hydrofluoric acid solution; and (2) a limited shrinkage. Preferably, the semiconductor substrate 10 is thermally annealed to form the densified gap filling silicon oxide trench fill dielectric layer 16' within the oxygen containing atmosphere at a temperature of greater than about 1100 degrees centigrade for a time period of greater than about 0.5 hours. More preferably, the semiconductor substrate 10 is thermally annealed to form the densified gap filling silicon oxide trench fill dielectric layer 16' within the oxygen containing atmosphere at a temperature of from about 1100 to about 1150 degrees centigrade for a time period of from about 1.5 to about 2.5 hours. Other conditions employed when thermally annealing within the oxygen containing atmosphere the semiconductor substrate 10 include: (1) a reactor chamber pressure of about 760 torr; (2) an oxygen concentration of about 100 volume percent; and (3) an oxygen flow of from about 8000 to about 12000 standard cubic centimeters per minute (sccm).

Figure 4:
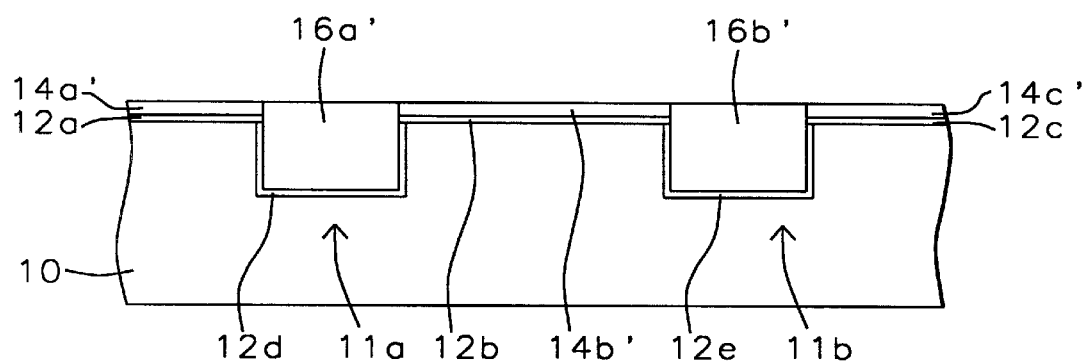

Referring now to FIG. 4, there is shown a schematic cross-sectional diagram illustrating the results of further processing of the semiconductor substrate 10 whose schematic cross-sectional diagram is illustrated in FIG. 3. Shown in FIG. 4 is the results of planarizing through a chemical mechanical polish (CMP) planarizing method the densified gap filling silicon oxide trench fill dielectric layer 16' to form within the corresponding isolation trenches 11a and 11b a pair of patterned planarized densified silicon oxide trench fill dielectric layers 16a' and 16b'.

While any of several parameters may be employed within the chemical mechanical polish (CMP) planarizing method for forming from the densified gap filling silicon oxide trench fill dielectric layer 16' the patterned planarized densified gap filling silicon oxide trench fill dielectric layers 16a' and 16b', the chemical mechanical polish (CMP) planarizing method employed within the preferred embodiment of the method of the present invention preferably employs: (1) a platen pressure of from about 7 to about 10 pounds per square inch (psi); (2) a rotation speed of from about 30 to about 60 revolutions per minute (rpm); and (3) an aqueous silica slurry comprising about 10 to about 20 weight percent silica at a flow rate of from about 100 to about 200 cubic centimeters per minute.

EXAMPLES 1–2

Upon each semiconductor substrate within a pair of (100) silicon semiconductor substrates was formed a thermally grown silicon oxide layer through a thermal oxidation method employing an oxygen ambient at: (1) a reactor chamber pressure of about 760 torr; (2) an oxygen volume concentration of about 100 percent; and (3) a temperature of about 1100 degrees centigrade, for a time period of about 120 minutes. The two thermally grown silicon oxide layers formed through the thermal oxidation method were formed to a thickness of about 7000 angstroms each.

Upon the thermally grown silicon oxide layer formed upon one of the silicon semiconductor substrates was then formed a gap filling silicon oxide layer formed through an ozone assisted sub-atmospheric pressure thermal chemical vapor deposition (SACVD) method employing an ozone oxidant and a tetra-ethyl-ortho-silicate (TEOS) silicon source material at a comparatively high ozone:TEOS volume ratio of about 13:1 conventional in the art of integrated circuit fabrication. The ozone assisted sub-atmospheric pressure thermal chemical vapor deposition (SACVD) method also employed: (1) a reactor chamber pressure of about 450 torr (without plasma activation); (2) a substrate temperature of about 400 degrees centigrade; (3) an ozone concentration of about 12 weight percent in an oxygen carrier gas; (4) a tetra-ethyl-ortho-silicate (TEOS) flow rate of about 35 standard cubic centimeters per minute (sccm); (5) an oxygen (ozone carrier gas) flow rate of about 5000 standard cubic centimeters per minute (sccm); and (6) a background helium carrier gas flow rate of about 2300 standard cubic centimeters per minute (sccm). The formation rate of the gap filling silicon oxide layer was measured and it is reported in Table I.

Upon the other of the two silicon semiconductor substrates was then formed a gap filling silicon oxide layer formed through an ozone assisted sub-atmospheric pressure thermal chemical vapor deposition (SACVD) method employing an ozone oxidant and a tetra-ethyl-ortho-silicate (TEOS) silicon source material at a comparatively low ozone:TEOS volume ratio of about 2:1 in accord with the preferred embodiment of the method of the present invention. The ozone assisted sub-atmospheric pressure chemical vapor deposition (SACVD) method also employed: (1) a reactor chamber pressure of about 60 torr (without plasma activation); (2) a substrate temperature of about 400 degrees centigrade; (3) an ozone concentration of about 12 weight percent in an oxygen carrier gas; (4) a tetra-ethyl-ortho-silicate (TEOS) flow rate of about 35 standard cubic centimeters per minute (sccm); (5) an oxygen (ozone carrier gas) flow rate of about 750 standard cubic centimeters per minute (sccm); and (6) a background helium carrier gas flow rate of about 2300 standard cubic centimeters per minute (sccm). The formation rate of the gap filling silicon oxide layer formed upon the second semiconductor substrate was also measured and its value is also reported in Table I.

TABLE I

| Substrate Layer | Ozone Assisted SACVD Low O3:TEOS | Silicon Oxide Formation Rate High O3:TEOS |
| --- | --- | --- |
| thermal oxide | 1670 A/minute | 120 A/minute |

From review of the data in Table I, it is seen that a significant increase in formation rate of a gap filling silicon oxide layer formed through an ozone assisted sub-atmospheric pressure thermal chemical vapor deposition (SACVD) method may be obtained by employing a comparatively low ozone:TEOS volume ratio of less than about 2:1 when forming the gap filling silicon oxide layer. Thus, by employing the comparatively low ozone:TEOS volume ratio there may be formed a gap filling silicon oxide trench fill layer through the method of the present invention with limited surface sensitivity.

EXAMPLES 3–12

Upon each semiconductor substrate within a series of twenty (100) silicon semiconductor substrates there was formed through a method equivalent to the method employed in examples 1–2 a thermally grown silicon oxide layer. Each of the thermally grown silicon oxide layers was formed to a thickness of about 7000 angstroms.

Upon each of ten of the semiconductor substrates was then formed a gap filling silicon oxide layer of thickness about 7000 angstroms formed through the sub-atmospheric pressure thermal chemical vapor deposition (SACVD) employing the comparatively low ozone:TEOS volume ratio of about 2:1 as disclosed in accord with example 2. Upon each of the ten remaining semiconductor substrates was then formed a composite gap filling silicon oxide layer formed of: (1) about 1000 angstroms of a gap filling silicon oxide layer formed through the sub-atmospheric pressure thermal chemical vapor deposition (SACVD) method employing the comparatively low ozone:TEOS volume ratio of about 2:1 as disclosed in accord with example 2; upon which was formed (2) about 6000 angstroms of a gap filling silicon oxide layer formed through the sub-atmospheric pressure thermal chemical vapor deposition (SACVD) method employing the comparatively high ozone:TEOS volume ratio of about 13:1 as disclosed in accord with example 1.

The gap filling silicon oxide layers upon the twenty semiconductor substrates were then exposed to various thermal annealing methods within either: (1) a nitrogen containing atmosphere comprising 100 percent nitrogen at a pressure of about 760 torr; or (2) an oxygen containing atmosphere comprising 100 percent oxygen at a pressure of about 760 torr. Through the various thermal annealing methods there was formed from the gap filling silicon oxide layers a corresponding series of densified gap filling silicon oxide layers. There was then measured, through methods as are conventional in the art, for each of the densified gap filling silicon oxide layers: (1) the etch rate of the densified gap filling silicon oxide layer within a 50:1 dilute hydroflouric acid solution; and (2) the shrinkage of the densified gap filling silicon oxide layer with respect to the corresponding gap filling silicon oxide layer. Measured values of etch rates of the densified gap filling silicon oxide layers within the 50:1 dilute hydrofluoric acid solution were then normalized to the etch rate of a thermally grown silicon oxide layer within the 50:1 dilute hydroflouric acid solution. The normalized values of the etch rates of the densified gap filling silicon oxide layers within the 50:1 dilute hydrofluoric acid solution are reported in TABLE II. The measured values of the shrinkage of the densified gap filling silicon oxide layers with respect to the corresponding gap filling silicon oxide layers are reported in TABLE III.

TABLE II

| | | Relative Etch Rate (50:1 Dilute HF) Silicon Oxide Layer Composition | |
| --- | --- | --- | --- |
| Example | Anneal Conditions | Thermal/ Low-O3/High-O3 | Thermal/Low-O3 |
| 3 | N2/1000C/2 hrs | 1.42 | 1.55 |
| 4 | N2/1100C/2 hrs | 1.16 | 1.30 |
| 5 | O2/1000C/30 mins | 1.40 | 1.55 |
| 6 | O2/1100C/30 mins | 1.10 | 1.15 |
| 7 | O2/1000C/2 hrs | 1.30 | 1.26 |
| 8 | O2/1100C/2 hrs | 1.07 | 1.10 |

TABLE III

| | | Percent Shrinkage Silicon Oxide Layer Composition | |
|---|---|---|---|
| Example | Anneal Conditions | Thermal/ Low-O3/High-O3 | Thermal/Low-O3 |
| 9 | N2/1000C/2 hrs | 5.43 | 11.3 |
| 10 | N2/1100C/2 hrs | 4.53 | 10.5 |
| 11 | O2/1000C/2 hrs | 5.53 | 11.7 |
| 12 | O2/1100C/2 hrs | 0.83 | 4.13 |

From review of the data in Table II, it is seen that by annealing within an oxygen containing atmosphere at a temperature of about 1100 degrees centigrade for a time period of about two hours a gap filling silicon oxide layer formed through a sub-atmospheric pressure thermal chemical vapor deposition (SACVD) method at the comparatively low ozone:TEOS volume ratio of about 2:1, there is formed a densified gap filling silicon oxide layer with a normalized wet etch rate within a 50:1 dilute hydrofluoric acid solution comparable to an analogous densified gap filling silicon oxide layer formed through a sub-atmosphefic pressure thermal chemical vapor deposition (SACVD) method at a comparatively high ozone:TEOS volume ratio of about 13:1 similarly annealed within an oxygen containing atmosphere at a temperature of about 1100 degrees centigrade for a time period of about two hours. As is also seen from review of the data in Table II, improvements in normalized wet etch rates are observed for densified gap filling silicon oxide layers formed through sub-atmospheric pressure thermal chemical vapor deposition (SACVD) methods when annealed at a temperature of about 1100 degrees centigrade for time periods at least as short as about 30 minutes.

Similarly, from review of the data in Table III, it is seen that by annealing within an oxygen containing atmosphere at a temperature of about 1100 degrees centigrade for a time period of about two hours the gap filling silicon oxide layer formed through the sub-atmospheric pressure thermal chemical vapor deposition (SACVD) method employing the comparatively low ozone:TEOS volume ratio of about 2:1 there is provided a densified gap filling silicon oxide layer with a substantial reduction in shrinkage. The densified gap filling silicon oxide layer is formed with a percent shrinkage somewhat less than the percentage shrinkage of a densified gap filling silicon oxide layer formed through an ozone assisted sub-atmospheric pressure thermal chemical vapor deposition (SACVD) method employing an ozone oxidant and a tetra-ethyl-ortho-silicate (TEOS) silicon source material at a comparatively high ozone:TEOS volume ratio and densified within a nitrogen containing atmosphere at a temperature of about 1100 degrees centigrade for a time period of about two hours.

Finally, although not necessarily related to directly forming within trenches within substrates employed within integrated circuit fabrication densified gap filling silicon oxide trench fill layers with limited surface sensitivity, there is observed from review of the data of Table III that the composite gap filling silicon oxide layer formed through the sub-atmospheric pressure thermal chemical vapor deposition (SACVD) method employing an ozone oxidant and a tetra-ethyl-ortho-silicate (TEOS) silicon source material at a comparatively high ozone:TEOS volume ratio of about 13:1 exhibits an exceedingly low percent shrinkage when densified within an oxygen containing atmosphere at a temperature of about 1100 degrees centigrade for a time period of about two hours. Such densified gap filling silicon oxide layers are particularly desirable where there is needed densified gap filling silicon oxide layers with minimal shrinkage, and therefore minimal stress. It is estimated that such densified gap filling silicon oxide layer may be formed through sub-atmospheric pressure thermal chemical vapor deposition (SACVD) methods employing an ozone oxidant and a tetra-ethyl-ortho-silicate (TEOS) silicon source material at a comparatively high ozone:TEOS volume ratio in the range of from about 10:1 to about 14:1. Such gap filling silicon oxide layers are typically and preferably formed to thicknesses of from about 6000 to about 8000 angstroms.

Thus, through the method of the present invention there is provided a densified gap filling silicon layer through which there may be formed, while avoiding a surface sensitivity, within isolation trenches within semiconductor substrates employed within integrated circuit fabrication patterned planarized densified silicon oxide trench fill dielectric layers with: (1) low etch rates in 50:1 dilute hydrofluoric acid; and (2) low shrinkage.

As is understood by a person skilled in the art, the preferred embodiment and examples of the method of the present invention are illustrative of the present invention rather than limiting of the present invention. Revisions and modifications may be made to methods, materials, structures and dimensions through which is practiced the preferred embodiment and examples of the method of the present invention while still providing embodiments and examples which are within the spirit and scope of the method of the present invention, as defined by the appended claims.

What is claimed is:

1. A method for forming a silicon oxide layer comprising:

providing a substrate;

forming over the substrate a second silicon oxide layer, the second silicon oxide layer being formed through a second ozone assisted sub-atmospheric pressure thermal chemical vapor deposition (SACVD) method, where the second ozone assisted sub-atmospheric pressure thermal chemical vapor deposition (SACVD) method employs an ozone oxidant and a tetra-ethyl-ortho-silicate (TEOS) silicon source material at a second ozone:TEOS volume ratio of less than about 2:1;

forming upon the second silicon oxide layer a first silicon oxide layer, the first silicon oxide layer being formed through a first ozone assisted sub-atmospheric pressure thermal chemical vapor deposition (SACVD) method, the first ozone assisted sub-atmospheric pressure thermal chemical vapor deposition (SACVD) method employing an ozone oxidant and a tetra-ethyl-ortho-silicate (TEOS) silicon source material at a first ozone-:TEOS volume ratio of from about 10:1 to about 14:1; and annealing thermally the substrate within an oxygen containing atmosphere at a temperature of greater than about 1100 degrees centigrade to form from the second silicon oxide layer and the first silicon oxide layer a corresponding densified second silicon oxide layer and a corresponding densified first silicon oxide layer.

2. The method of claim 1 wherein the thickness of the first silicon oxide layer is from about 6000 to about 8000 angstroms.

3. The method of claim 1 further comprising forming over the substrate a third silicon oxide layer prior to forming over the substrate the second silicon oxide layer wherein:

the second silicon oxide layer is formed upon the third silicon oxide layer; and the third silicon oxide layer is formed employing a thermal oxidation of a silicon substrate layer.

* * * * *

UNITED STATES PATENT AND TRADEMARK OFFICE
CERTIFICATE OF CORRECTION

| | | |
|---|---|---|
| PATENT NO. | : 6,043,136 | Page 1 of 1 |
| DATED | : March 28, 2000 | |
| INVENTOR(S) | : Syun-Ming Jang, Ying-Ho Chen, Chen-Hua Yu | |

It is certified that error appears in the above-identified patent and that said Letters Patent is hereby corrected as shown below:

On the Title Page, in item (54), the Title should read --
TRENCH FILLING METHOD EMPLOYING OXYGEN DENSIFIED GAP FILLING CVD SILICON OXIDE LAYER FORMED WITH LOW OZONE CONCENTRATION --.

Signed and Sealed this

Twenty-sixth Day of June, 2001

*Attest:*

Nicholas P. Godici

NICHOLAS P. GODICI
*Attesting Officer*  *Acting Director of the United States Patent and Trademark Office*